United States Patent
Tomikawa et al.

(10) Patent No.: US 9,930,791 B2
(45) Date of Patent: Mar. 27, 2018

(54) WIRING BOARD WITH BUILT-IN ELECTRONIC COMPONENT AND METHOD FOR MANUFACTURING THE SAME

(71) Applicant: IBIDEN CO., LTD., Ogaki (JP)

(72) Inventors: Mitsuhiro Tomikawa, Ogaki (JP); Kota Noda, Ogaki (JP); Nobuhisa Kuroda, Ogaki (JP); Haruhiko Morita, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 14/878,096

(22) Filed: Oct. 8, 2015

(65) Prior Publication Data

US 2016/0105957 A1 Apr. 14, 2016

(30) Foreign Application Priority Data

Oct. 8, 2014 (JP) ................... 2014-207431

(51) Int. Cl.
*H05K 1/16* (2006.01)
*H05K 3/46* (2006.01)
(Continued)

(52) U.S. Cl.
CPC ............ *H05K 3/4697* (2013.01); *H01G 4/12* (2013.01); *H01G 4/232* (2013.01); *H01G 4/30* (2013.01); *H01G 2/06* (2013.01); *H01L 23/3128* (2013.01); *H01L 2224/16227* (2013.01); *H01L 2224/48091* (2013.01); *H01L 2224/48227* (2013.01); *H01L 2224/73267* (2013.01); *H01L 2225/1058* (2013.01); *H01L 2924/15331* (2013.01); *H05K 1/115* (2013.01); *H05K 3/429* (2013.01); *H05K 3/4644* (2013.01); *H05K 2201/09545* (2013.01); *H05K 2201/09827* (2013.01); *H05K 2201/10015* (2013.01)

(58) Field of Classification Search
CPC ........ H05K 3/4697; H01G 4/12; H01G 4/232; H01G 4/30; H01G 2/06; H01L 23/3128
USPC .................. 174/260, 250, 255–257, 261, 262
See application file for complete search history.

(56) References Cited

U.S. PATENT DOCUMENTS

| 2010/0012364 A1* | 1/2010 | Kim ....................... H01L 24/24 174/260 |
| 2010/0163168 A1* | 7/2010 | Saita ................... H01L 21/4857 156/247 |
| 2015/0041199 A1* | 2/2015 | Lee ....................... H01G 4/005 174/260 |

FOREIGN PATENT DOCUMENTS

JP         2001-345560 A    12/2001

* cited by examiner

*Primary Examiner* — Tremesha S Willis
(74) *Attorney, Agent, or Firm* — Oblon, McClelland, Maier & Neustadt, L.L.P.

(57) ABSTRACT

A wiring board with a built-in electronic component includes a substrate having a cavity, an interlayer insulating layer formed on the substrate such that the interlayer insulating layer is covering the cavity of the substrate, a conductor layer formed on the interlayer insulating layer, an electronic component accommodated in the cavity of the substrate and including a rectangular cuboid body and three terminal electrodes such that each of the three terminal electrodes has a metal film form formed on an outer surface of the rectangular cuboid body, and via conductors formed in the interlayer insulating layer such that the via conductors are connecting the conductor layer and the three terminal electrodes of the electronic component. The three terminal electrodes are arrayed in parallel on the outer surface of the rectangular cuboid body such that adjacent terminal electrodes have the opposite polarities.

20 Claims, 16 Drawing Sheets

(51) Int. Cl.
*H01G 4/30* (2006.01)
*H01G 4/12* (2006.01)
*H01G 4/232* (2006.01)
*H05K 1/11* (2006.01)
*H05K 3/42* (2006.01)
*H01L 23/31* (2006.01)
*H01G 2/06* (2006.01)

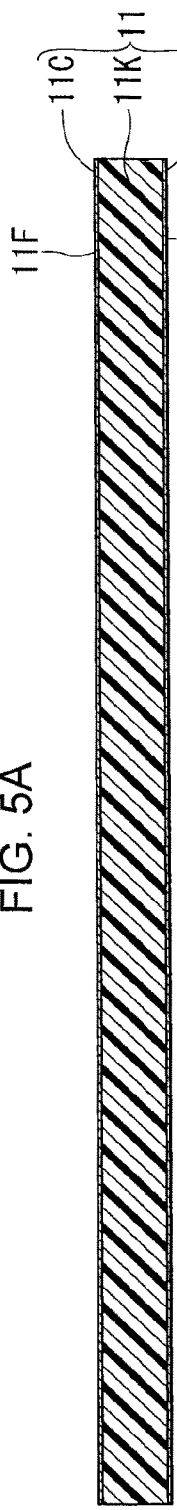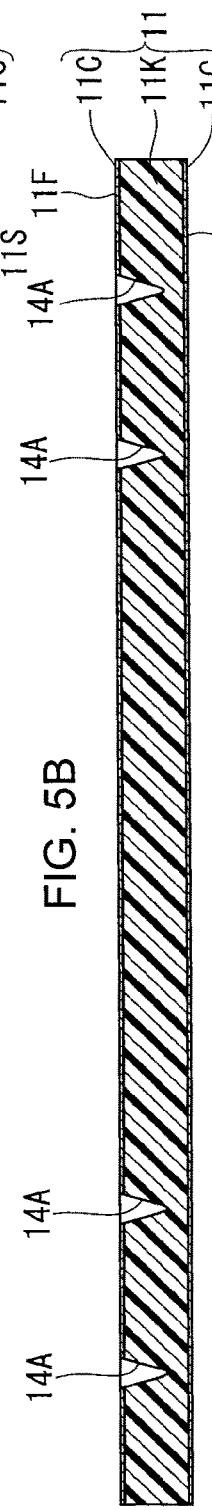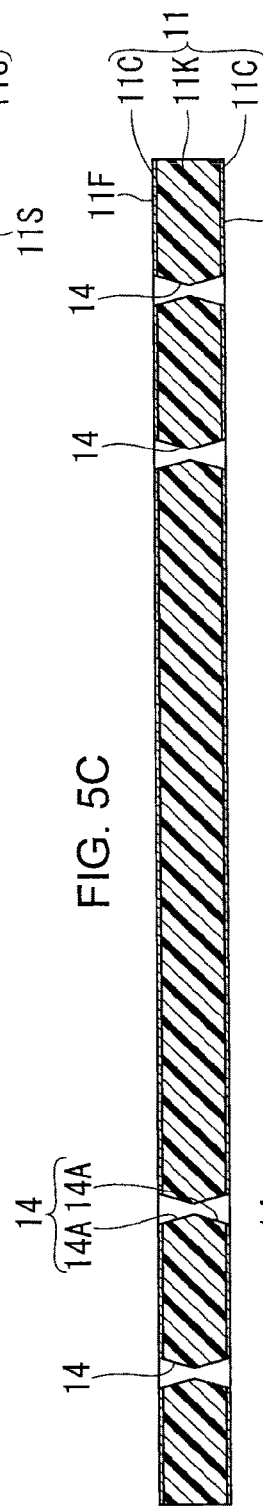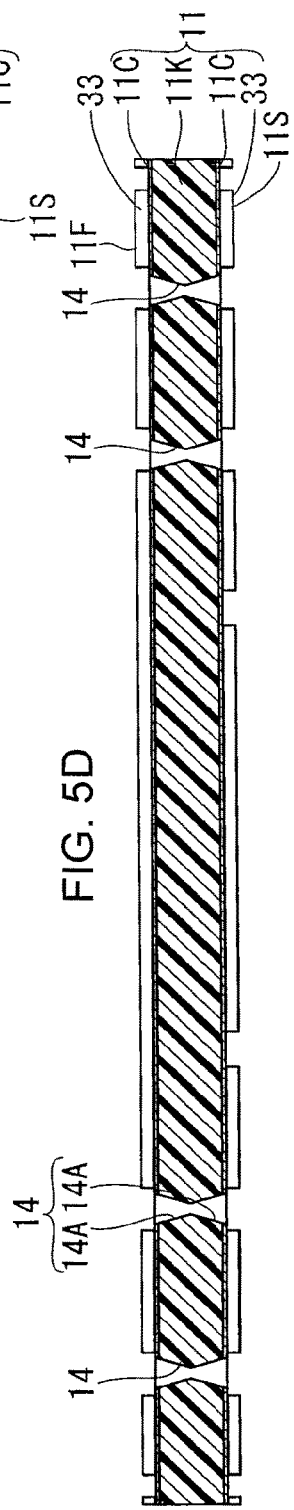

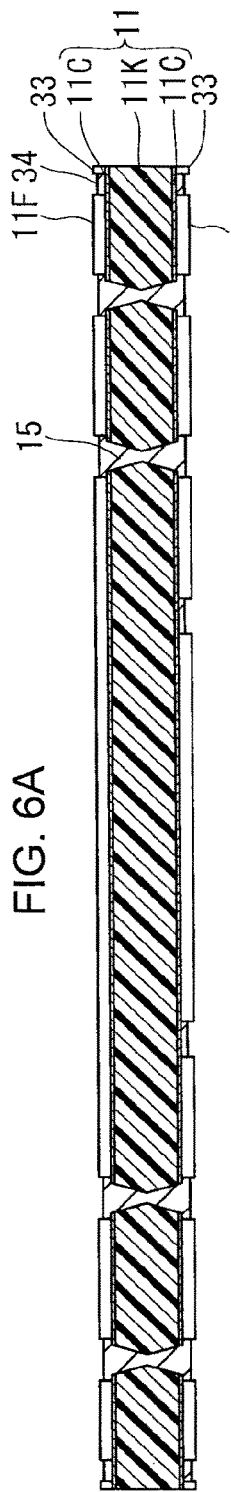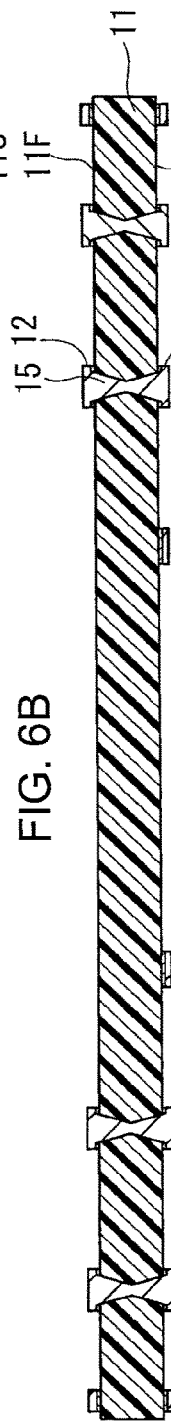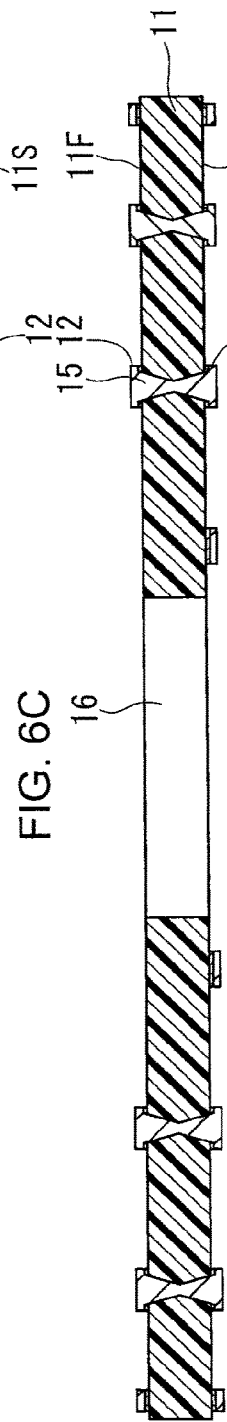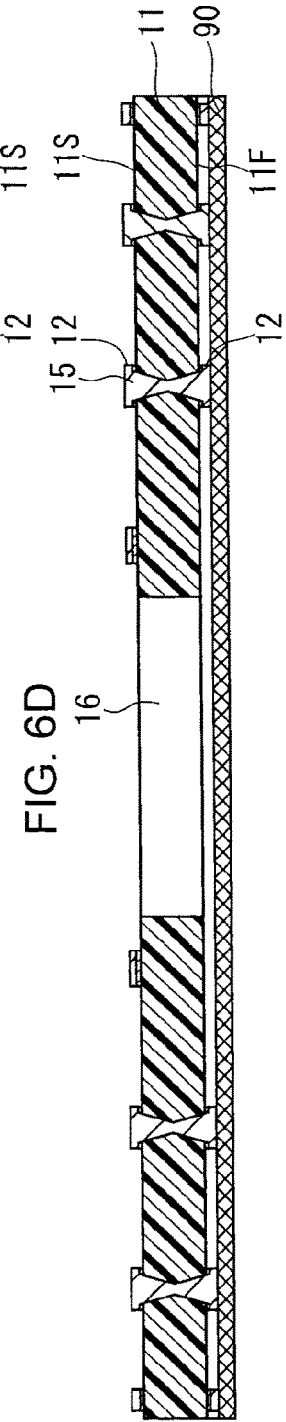

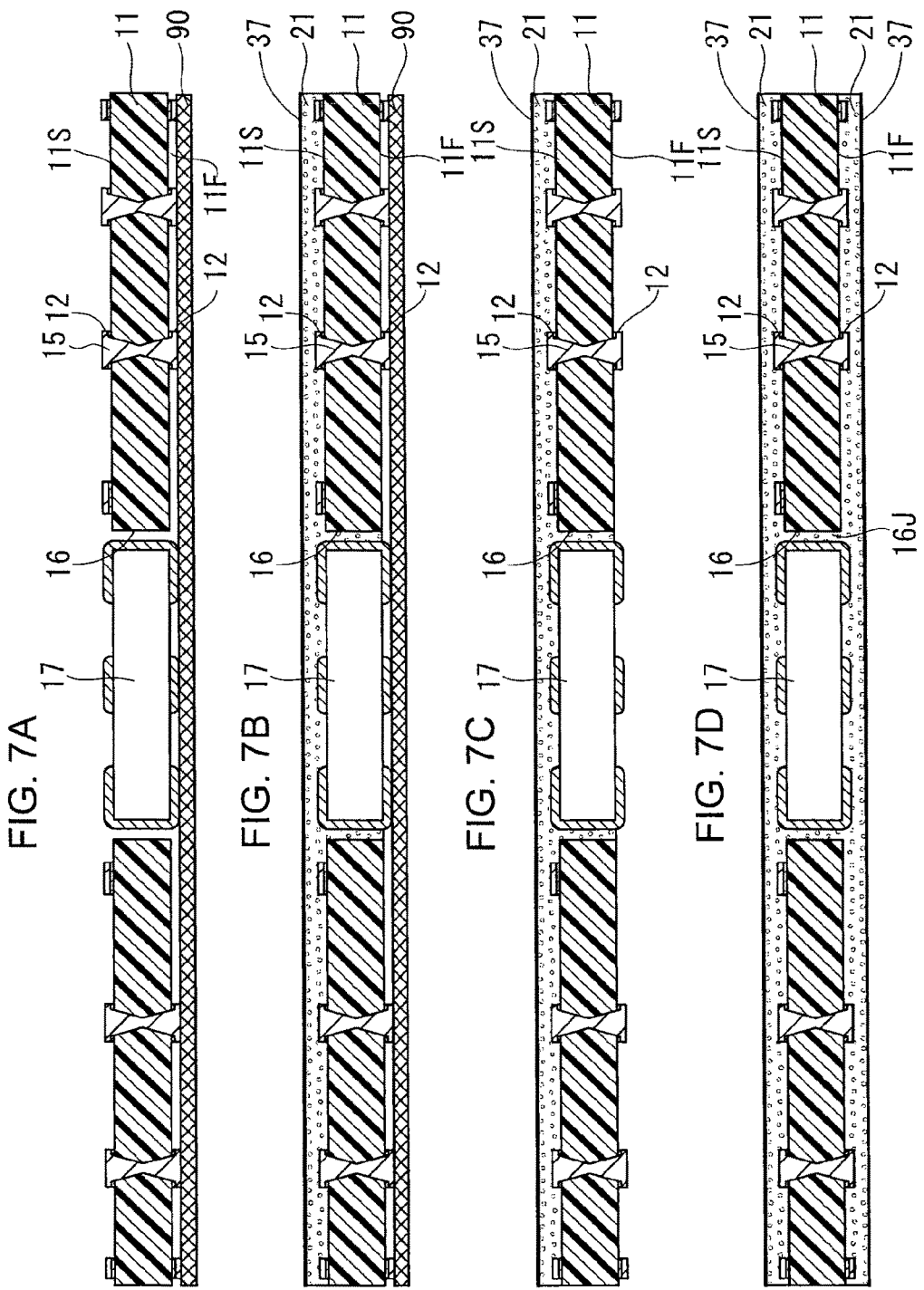

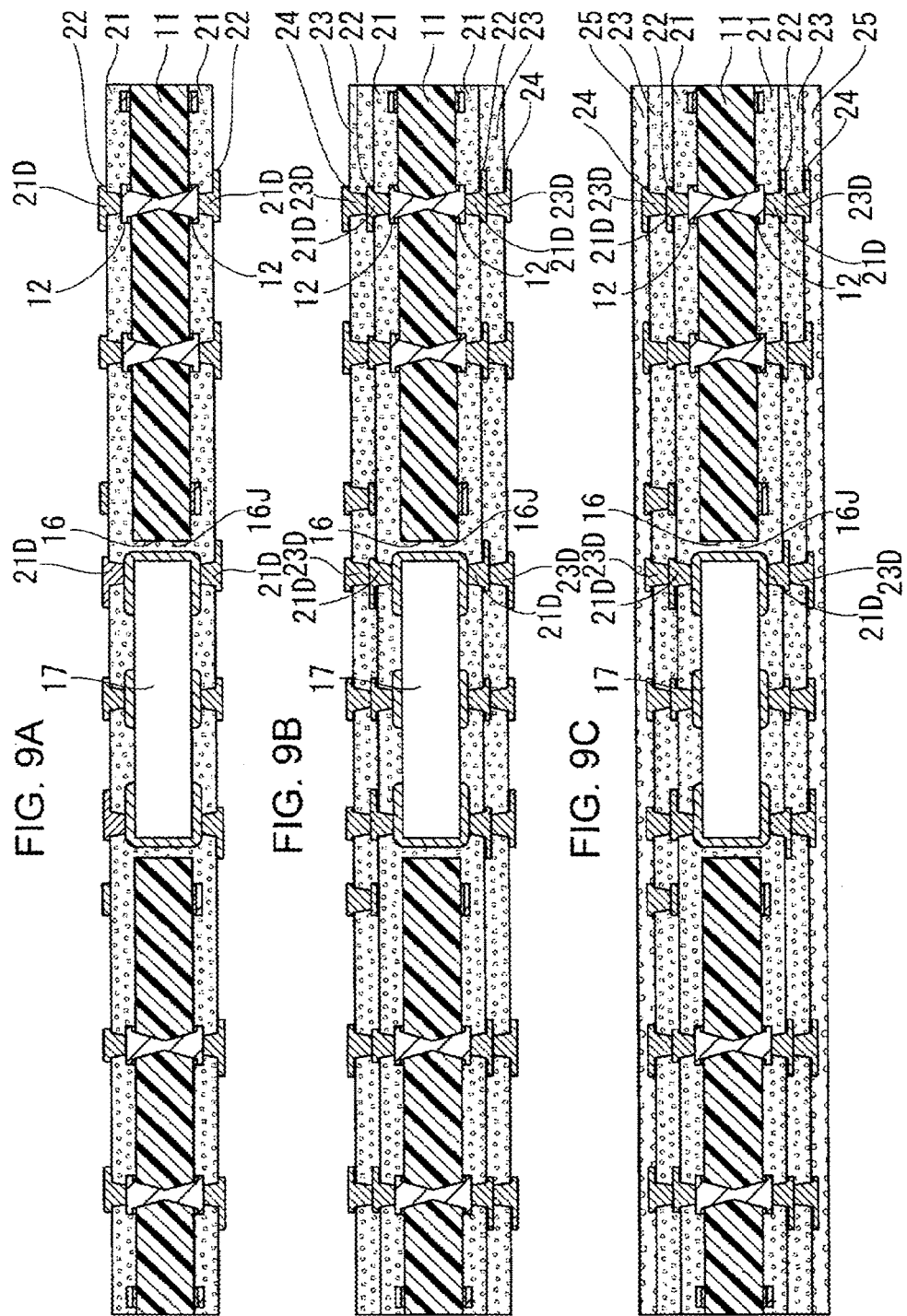

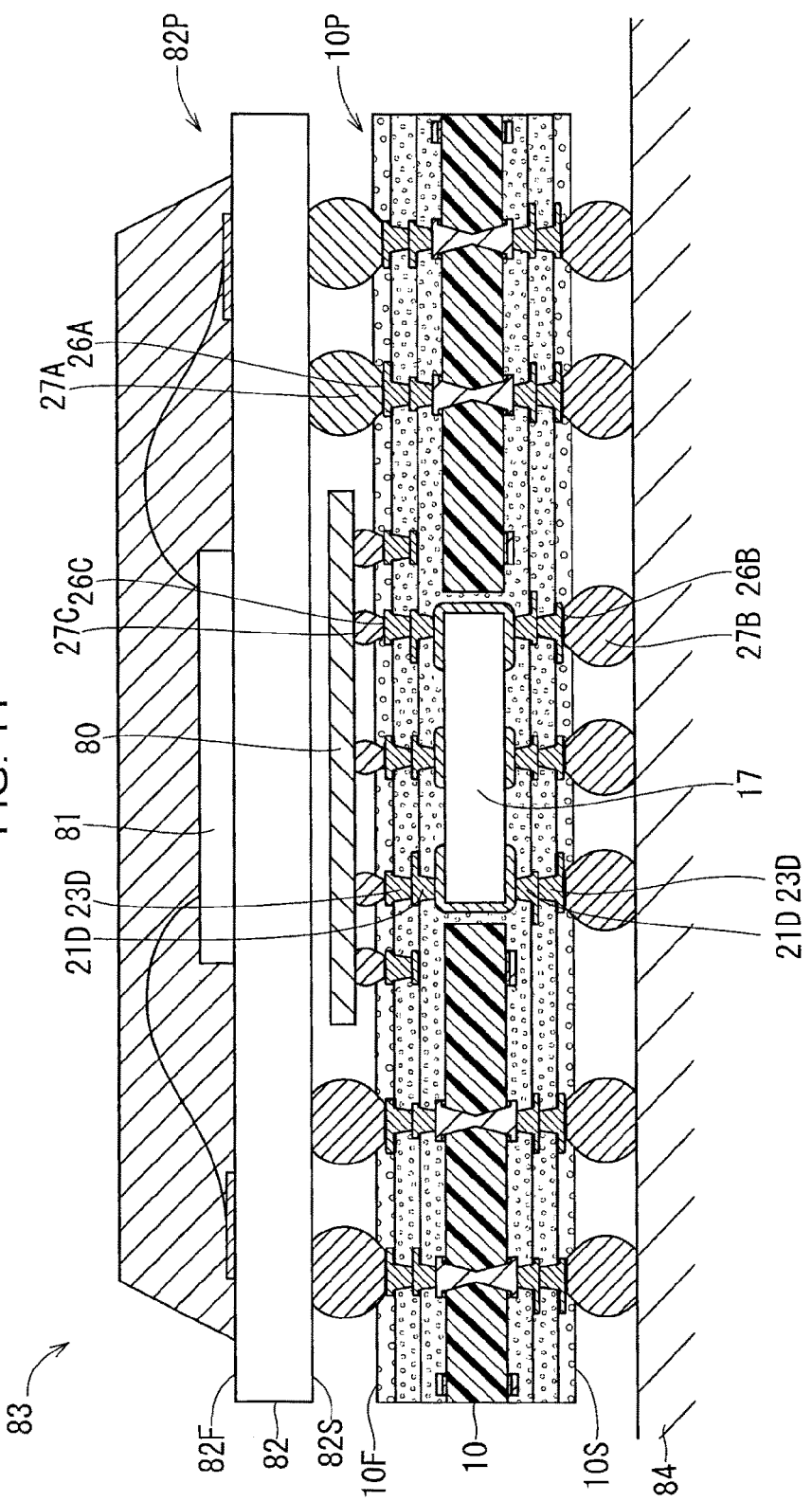

US 9,930,791 B2

WIRING BOARD WITH BUILT-IN ELECTRONIC COMPONENT AND METHOD FOR MANUFACTURING THE SAME

CROSS-REFERENCE TO RELATED APPLICATIONS

The present application is based upon and claims the benefit of priority to Japanese Patent Application No. 2014-207431, filed Oct. 8, 2014, the entire contents of which are incorporated herein by reference.

BACKGROUND OF THE INVENTION

Field of the Invention

The present invention relates to a wiring board with a built-in electronic component, in which an electronic component that is formed in a shape of a rectangular cuboid and has metal film-like terminal electrodes on its outer surface is accommodated in a cavity, and relates to a method for manufacturing the wiring board with a built-in electronic component.

Description of Background Art

Japanese Patent Laid-Open Publication No. 2001-345560 describes an electronic component in which two end parts of a main body part in a shape of a rectangular cuboid are covered by a pair of positive and negative terminal electrodes. The entire contents of this publication are incorporated herein by reference.

SUMMARY OF THE INVENTION

According to one aspect of the present invention, a wiring board with a built-in electronic component includes a substrate having a cavity, an interlayer insulating layer formed on the substrate such that the interlayer insulating layer is covering the cavity of the substrate, a conductor layer formed on the interlayer insulating layer, an electronic component accommodated in the cavity of the substrate and including a rectangular cuboid body and three terminal electrodes such that each of the three terminal electrodes has a metal film form formed on an outer surface of the rectangular cuboid body, and via conductors formed in the interlayer insulating layer such that the via conductors are connecting the conductor layer and the three terminal electrodes of the electronic component. The three terminal electrodes are arrayed in parallel on the outer surface of the rectangular cuboid body such that adjacent terminal electrodes have the opposite polarities.

According to another aspect of the present invention, a method for manufacturing a wiring board with a built-in electronic component includes forming a cavity in a substrate, positioning in the cavity of the substrate an electronic component including a rectangular cuboid body and three terminal electrodes such that each of the three terminal electrodes has a metal film form formed on an outer surface of the rectangular cuboid body, forming an interlayer insulating layer on the substrate such that the interlayer insulating layer covers the cavity of the substrate, forming a conductor layer on the interlayer insulating layer, and forming via conductors in the interlayer insulating layer such that the via conductors connect the conductor layer and the three terminal electrodes of the electronic component. The three terminal electrodes are arrayed in parallel on the outer surface of the rectangular cuboid body such that adjacent terminal electrodes have opposite polarities.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 5A-5D are cross-sectional side views illustrating processes for manufacturing a wiring board with a built-in electronic component;

FIG. 6A-6D are cross-sectional side views illustrating processes for manufacturing a wiring board with a built-in electronic component;

FIG. 7A-7D are cross-sectional side views illustrating processes for manufacturing a wiring board with a built-in electronic component;

FIG. 9A-9C are cross-sectional side views illustrating processes for manufacturing a wiring board with a built-in electronic component;

FIG. 11 is a cross-sectional side view of a PoP that includes a wiring board with a built-in electronic component;

DETAILED DESCRIPTION OF THE EMBODIMENTS

Figure 1:
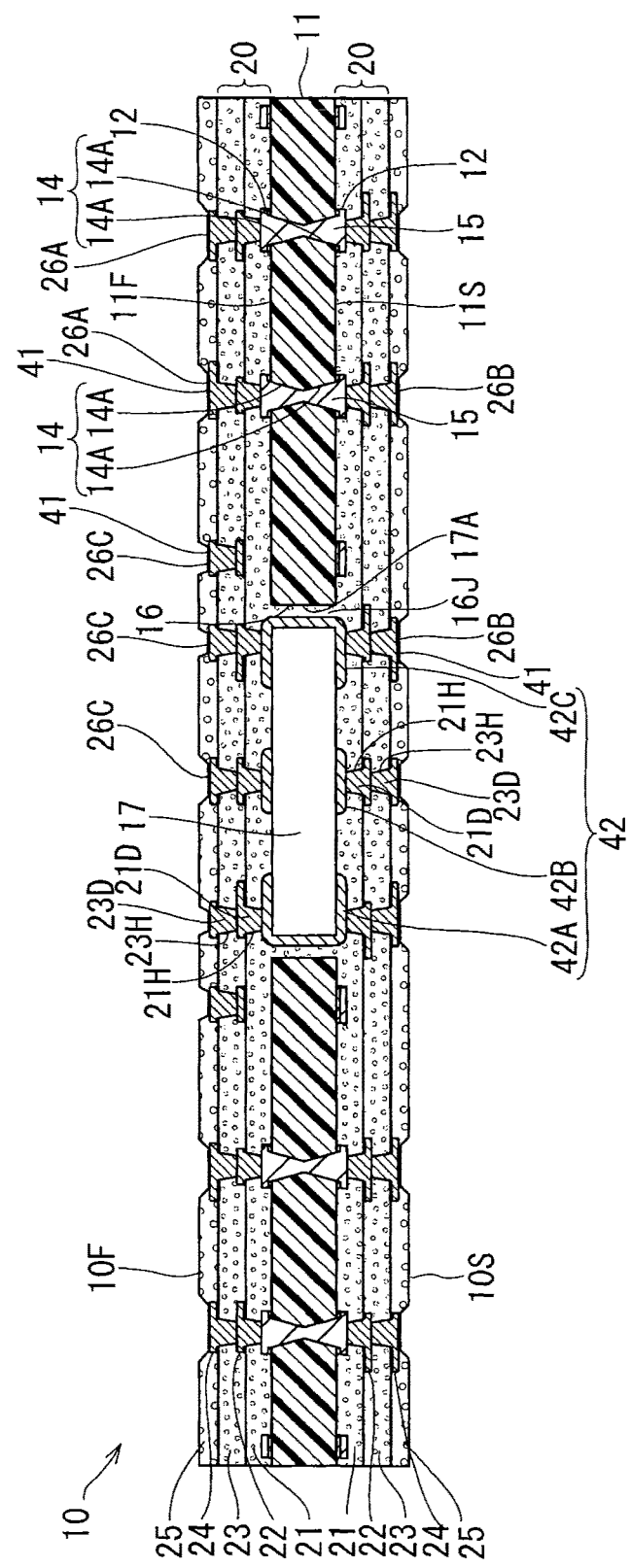
FIG. 1 is a cross-sectional side view of a wiring board with a built-in electronic component according to a first embodiment of the present invention.

The embodiments will now be described with reference to the accompanying drawings, wherein like reference numerals designate corresponding or identical elements throughout the various drawings.

First Embodiment

In the following, a first embodiment of the present invention is described based on FIG. 1-13. As illustrated in FIG. 1, in a wiring board 10 with a built-in electronic component of the present embodiment, build-up layers (20, 20) are respectively laminated on both front and back surfaces of a core substrate 11 (corresponding to a "substrate" according to an embodiment of the present invention). In the core substrate 11, a cavity 16 is formed penetrating through the core substrate 11. A multilayer ceramic capacitor 17 (hereinafter, referred to as a "MLCC 17") as an electronic component is accommodated in the cavity 16.

Figure 2A:
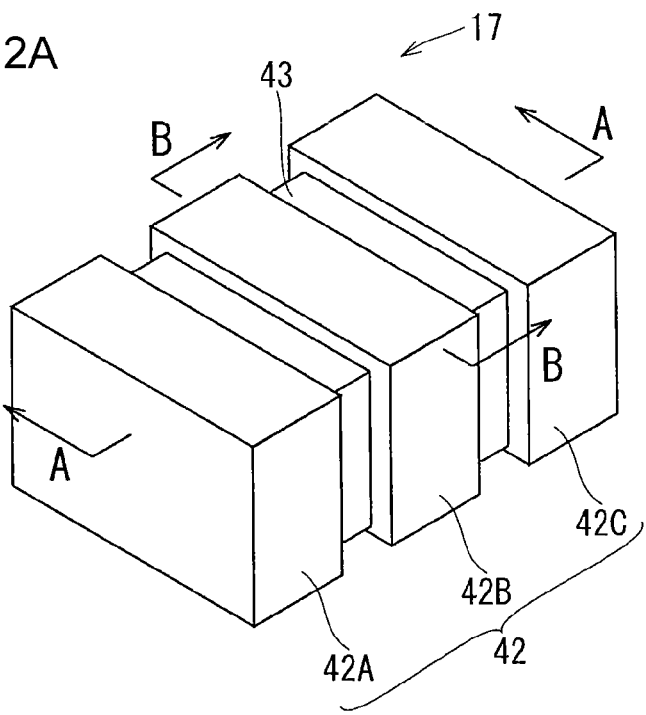
FIG. 2A is a perspective view of an MLCC.
Figure 3A:
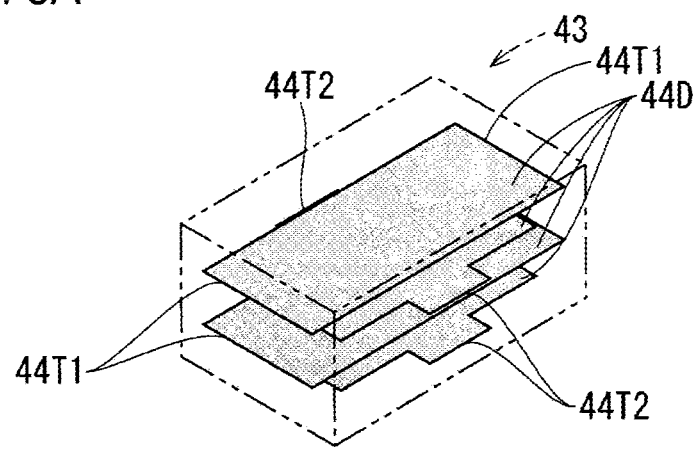
FIGS. 3A and 3B are conceptual diagrams of the MLCC.
Figure 3B:
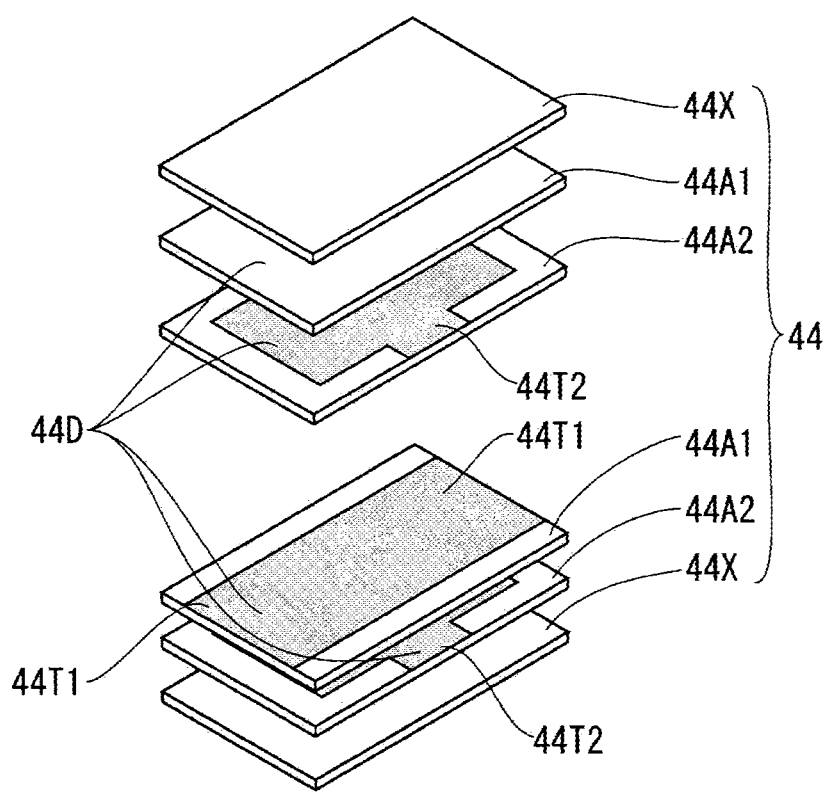

As illustrated in FIG. 2A, the MLCC 17 has three metal film-like terminal electrodes 42 that cover an outer surface of the MLCC 17. Specifically, for example, as illustrated in FIG. 3B, an element body 43 of the MLCC 17 excluding the terminal electrodes (42A, 42B, 42C) is formed by laminating multiple rectangular ceramic sheets 44 and has a shape of a rectangular cuboid that has a rectangular planar shape. The ceramic sheets 44 include internal electrode sheets (44A) (on one side of each of which an internal electrode (44D) is printed) and outer covering sheets (44X) (on each of which an internal electrode (44D) is not printed). Further, the internal electrode sheets (44A) are divided into first internal electrode sheets (44A1) for negative electrodes and second internal electrode sheets (44A2) for positive electrodes.

The first internal electrode sheets (44A1) for negative electrodes each have a structure in which two end parts of the internal electrode (44D) on a pair of sort-side outer edge parts of the ceramic sheet 44 are provided as a pair of first side-surface electrodes (44T1, 44T1) and there are no side-surface electrodes on a pair of long-side outer edge parts of the ceramic sheet 44. On the other hand, the second internal electrode sheets (44A2) for positive electrodes each have a structure in which a pair of second side-surface electrodes (44T2, 44T2) that are formed by extending the internal electrode (44D) are provided at centers of a pair of long-side outer edge parts of the ceramic sheet 44 and there are no side-surface electrodes on a pair of short-side outer edge parts.

The first internal electrode sheets (44A1) and the second internal electrode sheets (44A2) are alternately laminated, and are sandwiched by the outer covering sheets (44X, 44X). Thereby, the element body 43 is formed. As a result, as illustrated in FIG. 3A, a group of the first side-surface electrodes (44T1) for negative electrodes are arrayed on each entire short-side side surface of the element body 43 excluding two end parts in a lateral direction, and a group of the second side-surface electrodes (44T2) are arrayed at a center in a lateral direction on each long-side side surface of the element body 43.

Figure 2B:
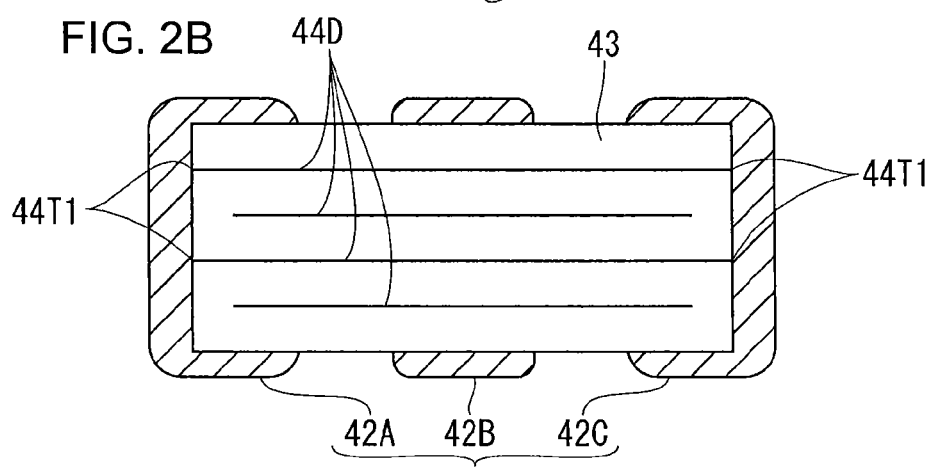
FIG. 2B is a cross-sectional view of the MLCC in an A-A cutting plane.
Figure 2C:
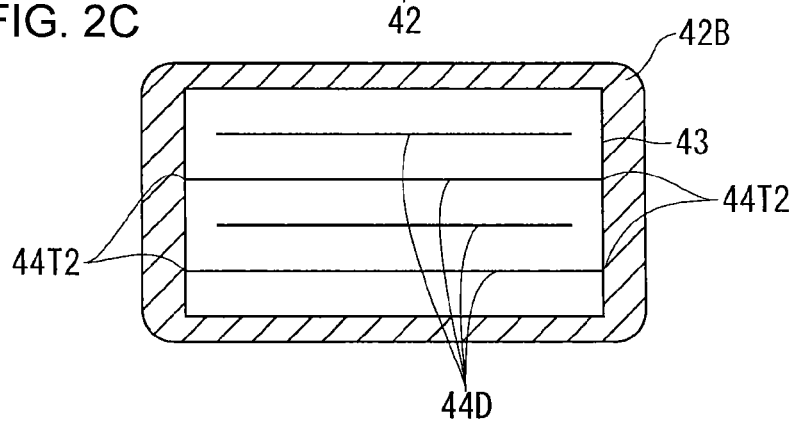
FIG. 2C is a cross-sectional view of the MLCC in a B-B cutting plane.

Then, as illustrated in FIG. 2B, on two end parts in a longitudinal direction of the element body 43, the terminal electrodes (42A, 42C) of negative electrodes (hereinafter, referred to as the "negative terminal electrodes (42A, 42C)") that are connected to the groups of the first side-surface electrodes (44T1) are provided, and on a central part in the longitudinal direction of the element body 43, as illustrated in FIG. 2C, the terminal electrode (42B) of a positive electrode (hereinafter, referred to as the "positive terminal electrode (42B)") that is connected to the second side-surface electrodes (44T2) is provided.

As illustrated in FIG. 2A, the negative terminal electrode (42A) on once side covers the entire side surface on the one side of the element body 43 (one end surface in the longitudinal direction of the element body 43) where the first side-surface electrodes (44T1) are arrayed, and covers end parts on the one side of two side surfaces and two upper and lower surfaces (two end surfaces in a lamination direction of the ceramic sheets 44) that are adjacent to the side surface on the one side. The negative terminal electrode (42C) on the other side is formed in the same shape. Further, the positive terminal electrode (42B) covers centers in the longitudinal direction of the two side surfaces of the element body 43 where the second side-surface electrodes (44T2) are arrayed and of the two upper and lower surfaces. As a result, as illustrated in FIG. 2A, a structure is achieved in which the negative terminal electrodes (42A, 42C) and the positive terminal electrode (42B) are arrayed in parallel on each of the surfaces of the element body 43 including the two side surfaces where the groups of the second side-surface electrodes (44T2) are arrayed and the two upper and lower surfaces. Further, the negative terminal electrodes (42A, 42C) and the positive terminal electrode (42B) have substantially the same width on each of the surfaces. Further, when the negative terminal electrodes (42A, 42C) and the positive terminal electrode (42B) are described without distinguishing, they are simply referred as the "terminal electrodes 42."

The core substrate 11 illustrated in FIG. 1 is formed using an insulating member. A conductor circuit layer 12 is formed on each of an F surface (11F), which is the front side surface of the core substrate 11, and an S surface (11S), which is the back side surface of the core substrate 11. Further, in addition to the cavity 16, electrical conduction through holes 14 are formed in the core substrate 11.

The MLCC 17 is accommodated in the cavity 16 of the core substrate 11. For example, an upper surface of the MLCC 17 is positioned on the F surface (11F) side of the core substrate 11, and a lower surface of the MLCC 17 is positioned on the S surface (11S) side of the core substrate 11. Further, the cavity 16 has a planar shape that is slightly larger than a planar shape of the entire MLCC 17 including the terminal electrodes 42. An element holding resin (16J) is filled in between the MLCC 17 and an inner side surface of the cavity 16. The MLCC 17 is positioned at a position spaced apart from the entire inner side surface of the cavity 16.

Further, a thickness of the entire MLCC 17 is slightly larger than a thickness of the core substrate 11. An outermost surface of the conductor circuit layer 12 on the F surface (11F) side of the core substrate 11 and an outermost surface of the terminal electrodes 42 on a front side surface of the MLCC 17 are substantially flush with each other; and an outermost surface of the conductor circuit layer 12 on the S surface (11S) side of the core substrate 11 and an outermost surface of the terminal electrodes 42 on a back side surface of the MLCC 17 are substantially flush with each other.

The electrical conduction through holes 14 are each formed in a middle-constricted shape in which small diameter side ends of tapered holes (14A, 14A) are communicatively connected, the tapered holes (14A, 14A) being respective formed by drilling from the F surface (11F) and the S surface (11S) of the core substrate 11 and being gradually reduced in diameter toward a deep side. The electrical conduction through holes 14 are filled with plating and through-hole electrical conductors 15 are respectively formed. The conductor circuit layer 12 on the F surface (11F) and the conductor circuit layer 12 on the S surface (11S) are connected by the through-hole electrical conductors 15.

Both the build-up layer 20 on the F surface (11F) side of the core substrate 11 and the build-up layer 20 on the S surface (11S) side of the core substrate 11 are formed by sequentially laminating, from the core substrate 11 side, a first insulating resin layer 21 (corresponding to an "interlayer insulating layer" according to an embodiment of the present invention), a first conductor layer 22 (corresponding to an "conductor layer" according to an embodiment of the present invention), a second insulating resin layer 23 and a second conductor layer 24. A solder resist layer 25 is laminated on the second conductor layer 24.

Via holes (21H) and via holes (23H) are respectively formed in the first insulating resin layer 21 and the second insulating resin layer 23. The via holes (21H, 23H) are all formed in a tapered shape that is gradually reduced in diameter toward the core substrate 11 side. The via holes (21H, 23H) are filled with plating and via conductors (21D, 23D) are formed. Then, the conductor circuit layer 12 and the first conductor layer 22, and, the MLCC 17 and the first conductor layer 22, are connected by the via conductors (21D) of the first insulating resin layer 21; and the first conductor layer 22 and the second conductor layer 24 are connected by the via conductors (23D) of the second insulating resin layer 23.

Figure 4:
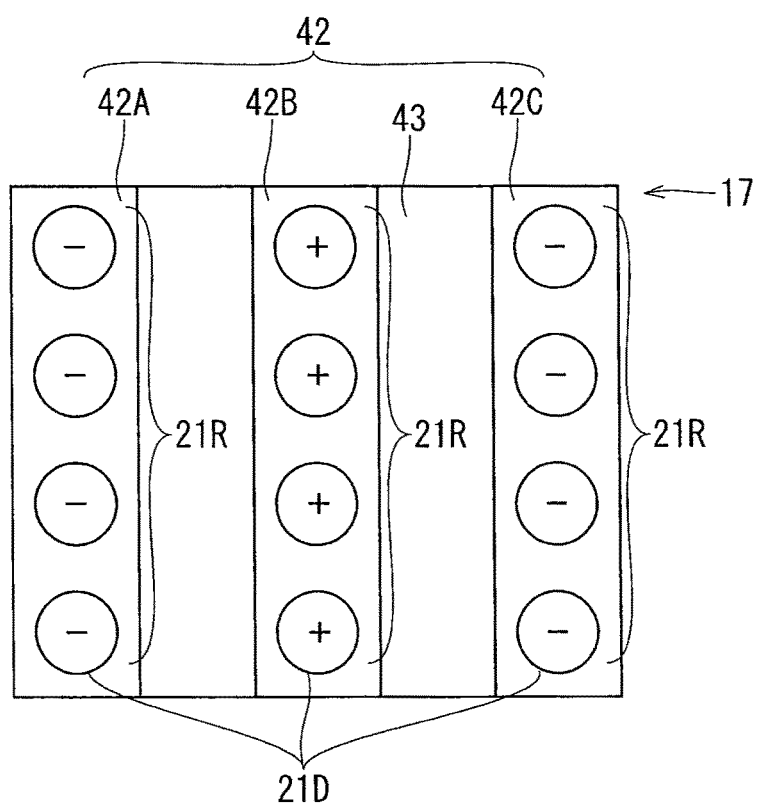
FIG. 4 is a plan view of the MLCC.

FIG. 4 illustrates connection positions of the via conductors (21D) with respect to the terminal electrodes 42 of the MLCC 17. As illustrated in 4, among the via conductors (21D), via conductors (21D) are array in a row for and are connected to each of the terminal electrodes 42 and form a via conductor row (21R). As a result, three via conductor rows (21R) are arrayed in parallel on each of front and back sides of the MLCC 17. Further, all of the via conductor rows (21R) include the same number of (for example, four) via conductors (21D), and the via conductors (21D) in each of the via conductor rows (21R) have the same shape and size and are formed at equal intervals. An interval between via conductors (21D, 21D) that are respectively included in adjacent via conductor rows (21R, 21R) and are positioned side by side is larger than the interval between via conductors (21D, 21D) that are included in the same via conductor row (21R).

Pad holes are formed in the solder resist layer 25, and a portion of the second conductor layer 24 positioned in each of the pad holes becomes a pad. On an F surface (10F), which is a front side surface of the entire wiring board 10 with a built-in electronic component, pads are formed including a group of large pads (26A) and a group of small pads (26C). The group of the small pads (26C) are arrayed in a form of a matrix, and the group of the large pads (26A) are arrayed in a form of a frame surrounding the group of the small pads (26C). On the other hand, pads on an S surface (10S), which is a back side surface of the entire wiring board 10 with a built-in electronic component, are formed as medium pads (26B) that are larger than the small pads (26C).

The wiring board 10 with a built-in electronic component of the present embodiment is manufactured as follows.

(1) As illustrated in FIG. 5A, a substrate as the core substrate 11 is prepared that is obtained by laminating a copper foil (11C) on each of both front and back surfaces of an insulating base material (11K) that is made of epoxy resin or BT (bismaleimide triazine) resin and a reinforcing material such as a glass cloth.

(2) As illustrated in FIG. 5B, the tapered holes (14A) for forming the electrical conduction through holes 14 (see FIG. 1) are drilled by irradiating, for example, CO2 laser to the core substrate 11 from the F surface (11F) side.

(3) As illustrated in FIG. 5C, the tapered holes (14A) are drilled on the S surface (11S) side of the core substrate 11 by irradiating CO2 laser to positions directly on the back of the above-described tapered holes (14A) on the F surface (11F) side. The electrical conduction through holes 14 are formed from the tapered holes (14A, 14A).

(4) An electroless plating treatment is performed. An electroless plating film (not illustrated in the drawings) is formed on the copper foil (11C) and on inner surfaces of the electrical conduction through holes 14.

(5) As illustrated in FIG. 5D, a plating resist 33 of a predetermined pattern is formed on the electroless plating film on the copper foil (11C).

(6) An electrolytic plating treatment is performed. As illustrated in FIG. 6A, the electrical conduction through holes 14 are filled with electrolytic plating and the through-hole electrical conductors 15 are formed; and an electrolytic plating film 34 is formed on a portion of the electroless plating film (not illustrated in the drawings) on the copper foil (11C), the portion being exposed from the plating resist 33.

(7) The plating resist 33 is peeled off, and the electroless plating film (not illustrated in the drawings) and the copper foil (11C), which are below the plating resist 33, are removed. As illustrated in FIG. 6B, by the remaining electrolytic plating film 34, electroless plating film and copper foil (11C), the conductor circuit layer 12 is formed on the F surface (11F) of the core substrate 11, and the conductor circuit layer 12 is formed on the S surface (11S) of the core substrate 11. Then, the conductor circuit layer 12 on the F surface (11F) and the conductor circuit layer 12 on the S surface (11S) are in a state of being connected by the through-hole electrical conductors 15.

(8) As illustrated in FIG. 6C, the cavity 16 is formed in the core substrate 11 using a router or CO2 laser.

(9) As illustrated in FIG. 6D, a tape 90 made of a PET film is affixed to the F surface (11F) of the core substrate 11 so as to close the cavity 16.

(10) The MLCC 17 is prepared.

(11) As illustrated in FIG. 7A, the MLCC 17 is accommodated in the cavity 16 using a mounter (not illustrated in the drawings).

(12) As illustrated in FIG. 7B, a prepreg (a resin sheet of a B-stage formed by impregnating a core material with resin) as the first insulating resin layer 21 and a copper foil 37 are laminated on the conductor circuit layer 12 on the F surface (11F) of the core substrate 11, and then, the resulting substrate is hot-pressed. In doing so, spacing between the conductor circuit layers (12, 12) on the S surface (11S) of the core substrate 11 is filled with the prepreg, and a gap between the inner surface of the cavity 16 and the MLCC 17 is filled with thermosetting resin exuded from the prepreg.

(13) As illustrated in FIG. 7C, the tape 90 is removed.

(14) As illustrated in FIG. 7D, a prepreg as the first insulating resin layer 21 and a copper foil 37 are laminated on the conductor circuit layer 12 on the F surface (11F) of the core substrate 11, and then, the resulting substrate is hot-pressed. In doing so, spacing between the conductor circuit layers (12, 12) on the F surface (11F) of the core substrate 11 is filled with the prepreg, and a gap between an inner surface of the cavity 16 and the MLCC 17 is filled with thermosetting resin exuded from the prepreg. Further, the above-described element holding resin (16J) is formed by the thermosetting resin that exudes from the prepregs on the F surface (11F) and the S surface (11S) of the core substrate 11 and is filled in the gap between the inner surface of the cavity 16 and the MLCC 17.

Instead of the prepreg, it is also possible to use a resin film that does not contain a core material as the first insulating resin layer 21. In this case, without laminating a copper foil, a conductor circuit layer can be directly formed on a surface of the resin film using a semi-additive method.

Figure 8A:
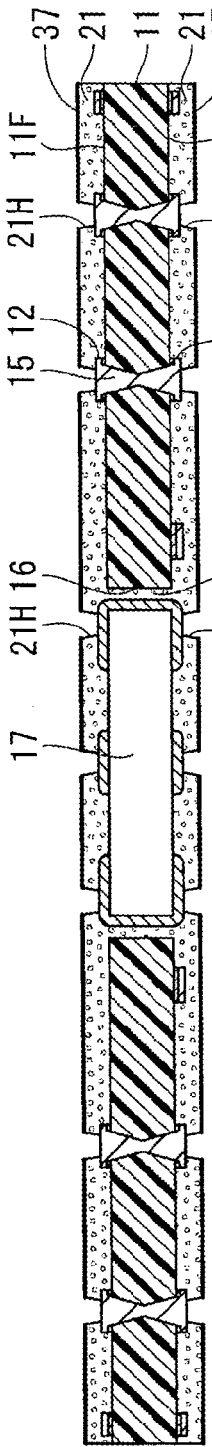
FIG. 8A-8C are cross-sectional side views illustrating processes for manufacturing a wiring board with a built-in electronic component.

(15) As illustrated in FIG. 8A, the via holes (21H) are formed by irradiating CO2 laser to the first insulating resin layers (21, 21) that are respectively formed on the front and back sides of the core substrate 11 by the prepregs. Among the via holes (21H), some via holes (21H) are positioned on the conductor circuit layers 12 and other via holes (21H) are positioned on the MLCC 17.

(16) An electroless plating treatment is performed. Electroless plating films (not illustrated in the drawings) are formed on the first insulating resin layers (21, 21) and in the via holes (21H, 21H).

Figure 8B:
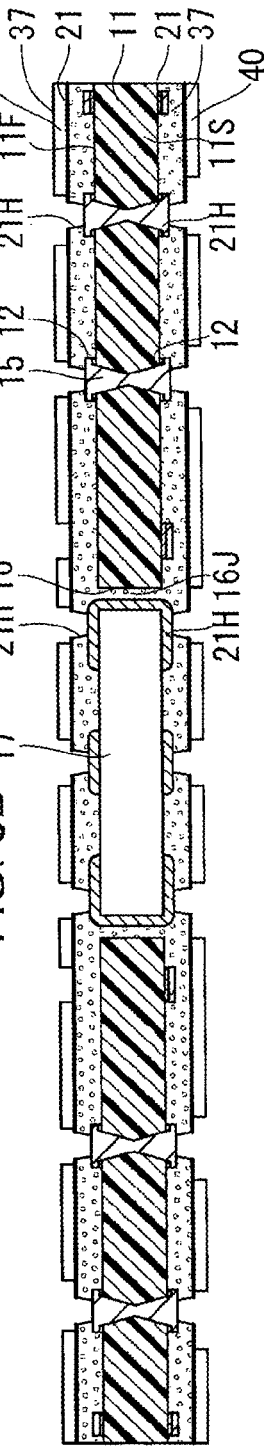

(17) As illustrated in FIG. 8B, plating resists 40 of predetermined patterns are respectively formed on the electroless plating films on the copper foils 37.

Figure 8C:
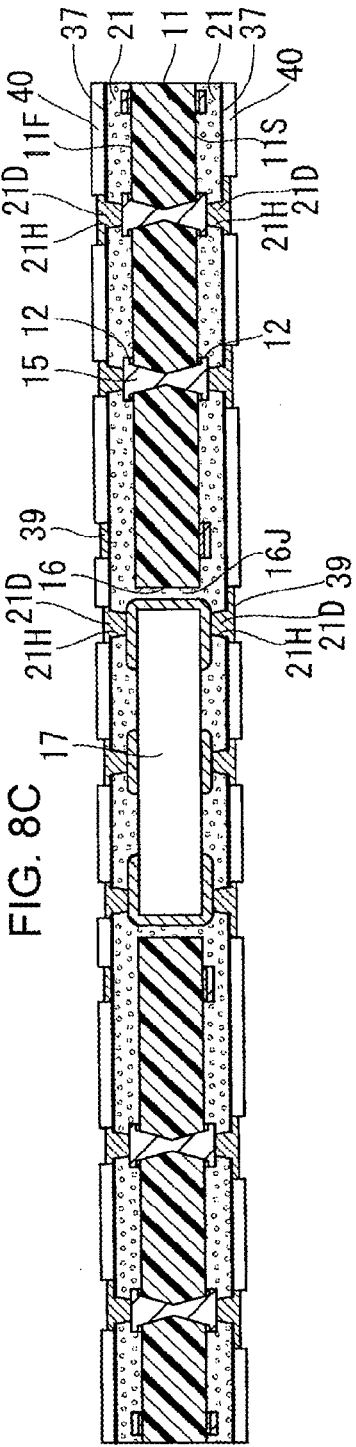

(18) An electrolytic plating treatment is performed. As illustrated in FIG. 8C, the via holes (21H, 21H) are filled with plating and the via conductors (21D, 21D) are formed. Further, electrolytic plating films (39, 39) are formed on portions of the electroless plating films (not illustrated in the drawings) on the first insulating resin layers (21, 21), the portions being exposed from the plating resists 40.

(19) The plating resists 40 are removed, and the electroless plating films (not illustrated in the drawings) and the copper foils 37, which are below the plating resists 40, are removed. As illustrated in FIG. 9A, the first conductor layers 22 are respectively formed on the first insulating resin layers 21 on the front and back sides of the core substrate 11 by the remaining electrolytic plating films 39, electroless plating films and copper foils 37. Then, a state is achieved in which, on each of the front and back sides of the core substrate 11, a portion of the first conductor layer 22 and the conductor circuit layer 12 are connected by the via conductors (21D), and the other portion of the first conductor layer 22 and the MLCC 17 are connected by the via conductors (21D).

(20) By the same processing as described in the above (12)-(19), as illustrated in FIG. 9B, a state is achieved in which, on each of the front and back sides of the core substrate 11, the second insulating resin layer 23 and the second conductor layer 24 are formed on the first conductor layer 22, and a portion of the second conductor layer 24 and the first conductor layer 22 are connected by the via conductors (23D).

(21) As illustrated in FIG. 9C, the solder resist layers (25, 25) are respectively laminated on the second conductor layers 24 on the front and back sides of the core substrate 11.

Figure 10:
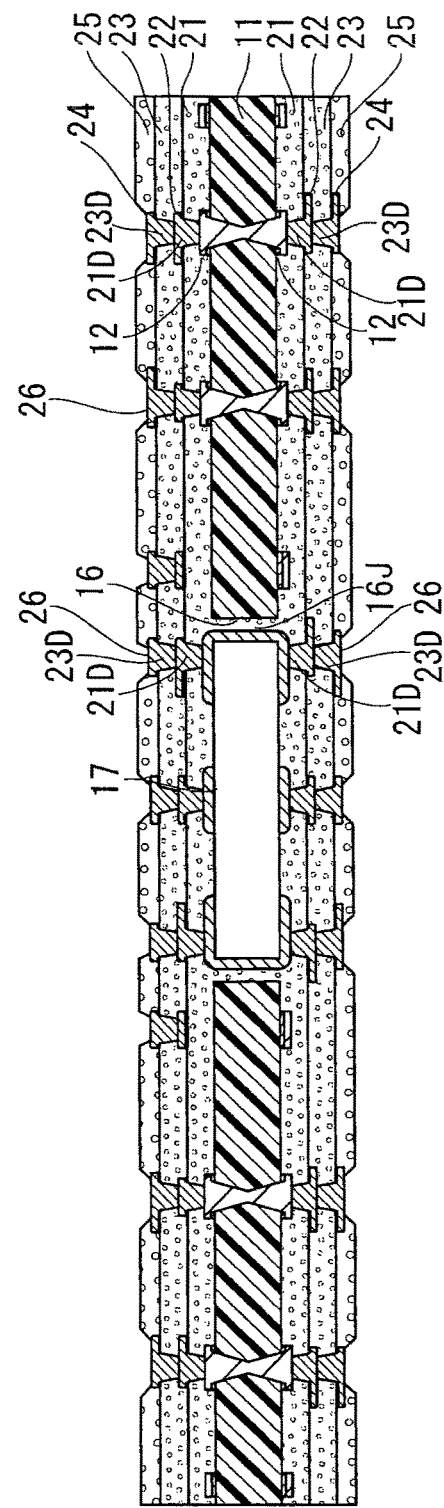
FIG. 10 is a cross-sectional side view illustrating a process for manufacturing a wiring board with a built-in electronic component.

(22) As illustrated in FIG. 10, tapered pad holes are formed at predetermined places on the solder resist layers (25, 25) on the front and back sides of the core substrate 11, and portions of the second conductor layers 24 on the front and back sides of the core substrate 11 that are exposed from the pad holes become the pads 26.

(23) On each of the pads 26, a nickel layer, a palladium layer and a gold layer are laminated in this order and a metal film 41 illustrated in FIG. 1 is formed. As a result, the wiring board 10 with a built-in electronic component is completed.

The description about the structure and the manufacturing method of the wiring board 10 with a built-in electronic component of the present embodiment is as given above. Next, an operation effect of the wiring board 10 with a built-in electronic component, together with an example of use of the wiring board 10 with a built-in electronic component, is described. The wiring board 10 with a built-in electronic component of the present embodiment is used, for example, as follows. That is, as illustrated in FIG. 11, large, medium and small solder bumps (27A, 27B, 27C) that respectively match the sizes of the above-described large, medium and small pads (26A, 26B, 26C) of the wiring board 10 with a built-in electronic component are respectively formed on the large, medium and small pads (26A, 26B, 26C). Then, for example, a CPU 80 having on a lower surface a group of pads that are positioned in the same way as the group of the small pads of the F surface (10F) of the wiring board 10 with a built-in electronic component is mounted on and is soldered to the group of the small solder bumps (27C) of each product region (R2), and a first package substrate (10P) is formed. Here, the pads of the CPU 80 are connected to the MLCC 17 via the via conductors (21D, 23D).

Next, a second package substrate (82P) that is obtained by mounting a memory 81 on an F surface (82F) of a circuit substrate 82 is positioned from an upper side of the CPU 80 on the first package substrate (10P). The large solder bumps (27A) of the wiring board 10 with a built-in electronic component of the first package substrate (10P) are soldered to pads that are provided on an S surface (82S) of the circuit substrate 82 of the second package substrate (82P), and thereby a PoP 83 (Package on Package 83) is formed. Spacing between the wiring board 10 with a built-in electronic component and the circuit substrate 82 in the PoP 83 is filled with resin (not illustrated in the drawings).

Next, the PoP 83 is positioned on a motherboard 84. The medium solder bumps (27B) of the wiring board 10 with a built-in electronic component of the PoP 83 are soldered to a group of pads of the motherboard 84. In this case, for example, pads for grounding that the motherboard 84 has are connected to the negative terminal electrodes (42A, 42C) of the MLCC 17 via the via conductors (21D, 23D). Then, the MLCC 17 can be used, for example, as a bypass capacitor for removing high frequency noises.

Figure 12A:
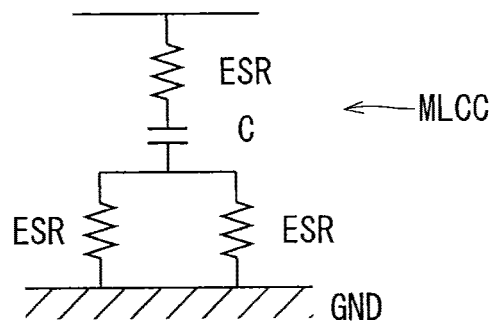
FIG. 12A-12D are diagrams of circuits that each include MLCC.
Figure 12B:
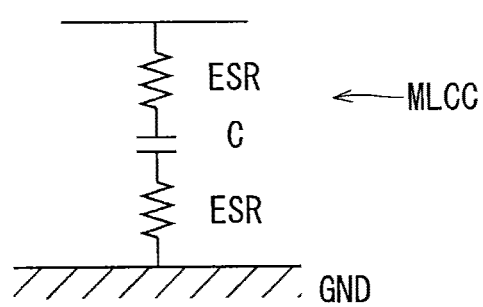

Specifically, as illustrated in FIG. 12A, among the three terminal electrodes 42, the two terminal electrodes 42 that have the same polarity (in the present embodiment, the negative terminal electrodes (42A, 42C)) are connected to the ground, and the one remaining terminal electrode 42 of the other polarity (in the present embodiment, the positive terminal electrode (42B)) is connected a power line or a signal line (hereinafter, these are collectively referred to as a "conduction line"). As a result, as illustrated in FIG. 12B, as compared to a case where a bipolar MLCC 17 is connected between the ground and a conduction line, ESR can be reduced, and power loss in a circuit in which influence of ESR is large can be suppressed.

In the present embodiment, the terminal electrodes 42 of negative electrodes (the negative terminal electrodes (42A, 42C)) are connected to the ground. However, among the positive and negative terminal electrodes of the MLCC, a terminal electrode of any polarity may be connected to the ground. Further, among the three terminal electrodes, the terminal electrode at the center may be either a positive or a negative terminal electrode; and the terminal electrodes at the two ends may be either positive or negative terminal electrodes.

Figure 12C:
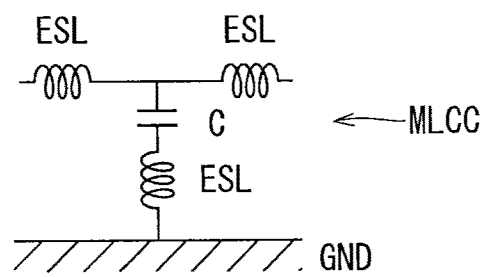
Figure 12D:
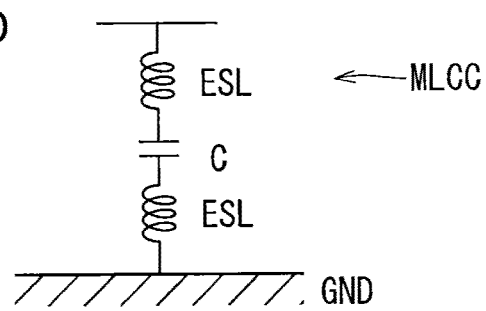

Further, in the case where ESL is a more important problem than ESR, as illustrated in FIG. 12C, among the three terminal electrodes 42, the two terminal electrodes 42 of the same polarity can be connected in series in the middle of a conduction line, and the remaining one terminal electrode 42 of the other polarity can be connected to the ground. By doing so, as illustrated in FIG. 12D, as compared to a case where a bipolar MLCC 17 is connected between the ground and a conduction line, ESL between the ground and the conduction line can be reduced, and power loss in a circuit in which influence of ESL is large can be suppressed.

In this way, the MLCC 17 that is built in the wiring board 10 with a built-in electronic component of the present embodiment has a tripolar structure in which one more terminal electrode 42 is further added to a MLCC that has only positive and negative bipolar terminal electrodes.

Therefore, in a circuit of the wiring board 10 with a built-in electronic component, a degree of freedom in positioning ESL and ESR of the MLCC 17 can be increased. As a result, the MLCC 17 can be connected such that power supplied to the circuit or power loss in accordance with a signal frequency is reduced. Further, in the MLCC 17 of the present embodiment, the negative terminal electrodes (42A, 42C) that are connected to the ground are provided at the two ends of the MLCC 17. Therefore, a circuit structure in which two negative electrodes are connected to the ground can be easily realized.

Further, the cavity 16 penetrate through the core substrate 11, and the MLCC 17 accommodated in the cavity 16 is provided with the terminal electrodes 42 on both front and back surfaces of the MLCC 17. Therefore, the MLCC 17 can be connected to circuits on the front and back sides of the core substrate 11 in short distances, ESL and ESR of an entire circuit of the wiring board 10 with a built-in electronic component including the MLCC 17 can be suppressed, and power loss can be reduced.

Figure 13:
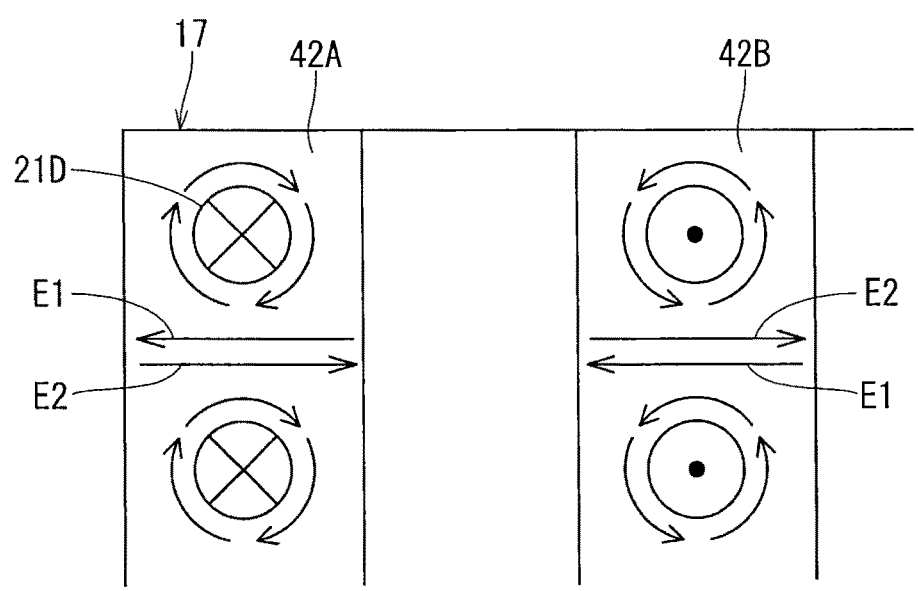
FIG. 13 is a plan view of via conductors connected to MLCC.

Via conductors (21D) are connected to each of the terminal electrodes 42. Therefore, among the via conductors (21D) that are connected to a common terminal electrode, as illustrated in FIG. 13, a magnetic field (E1) around one of adjacent via conductors (21D) and a magnetic field (E2) around the other one of the adjacent via conductors (21D) are oriented in opposite directions, and thus occurrence of magnetic noise can be suppressed.

Second Embodiment

Figure 14:
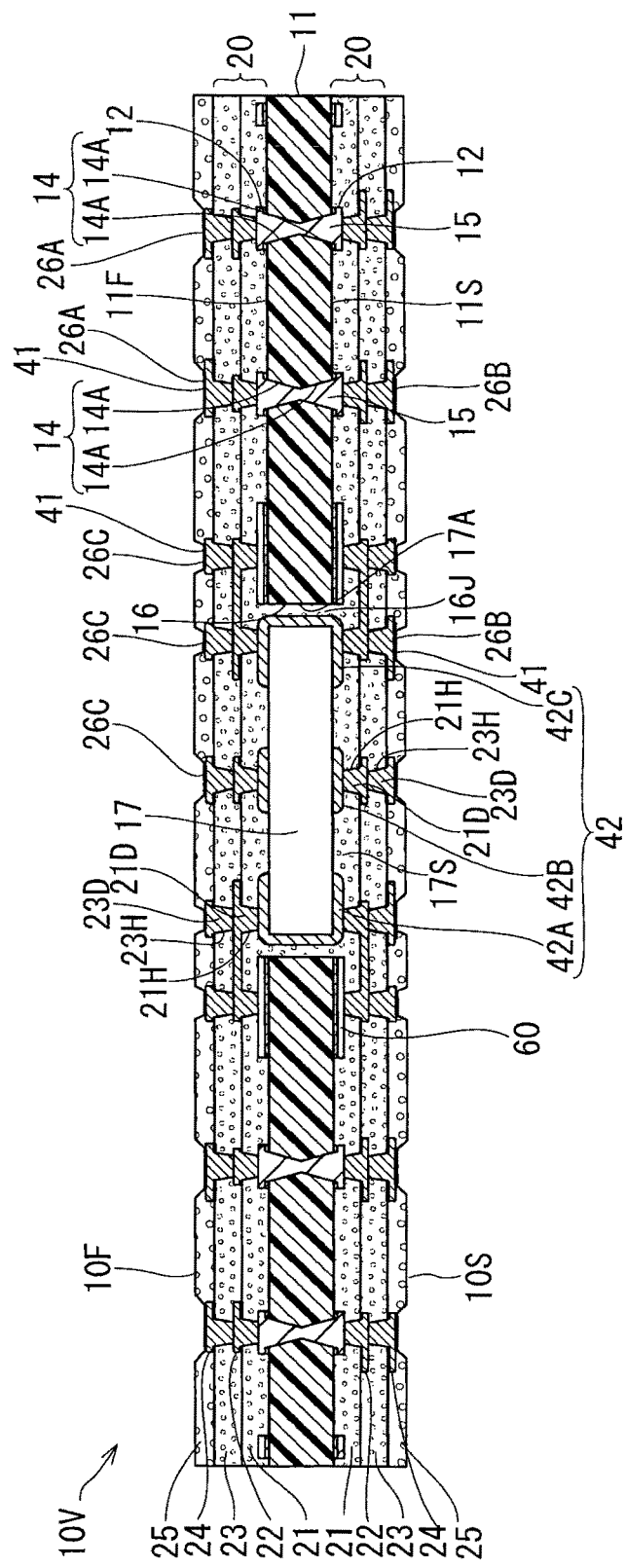
FIG. 14 is a cross-sectional side view of a wiring board with a built-in electronic component according to a second embodiment.
Figure 15:
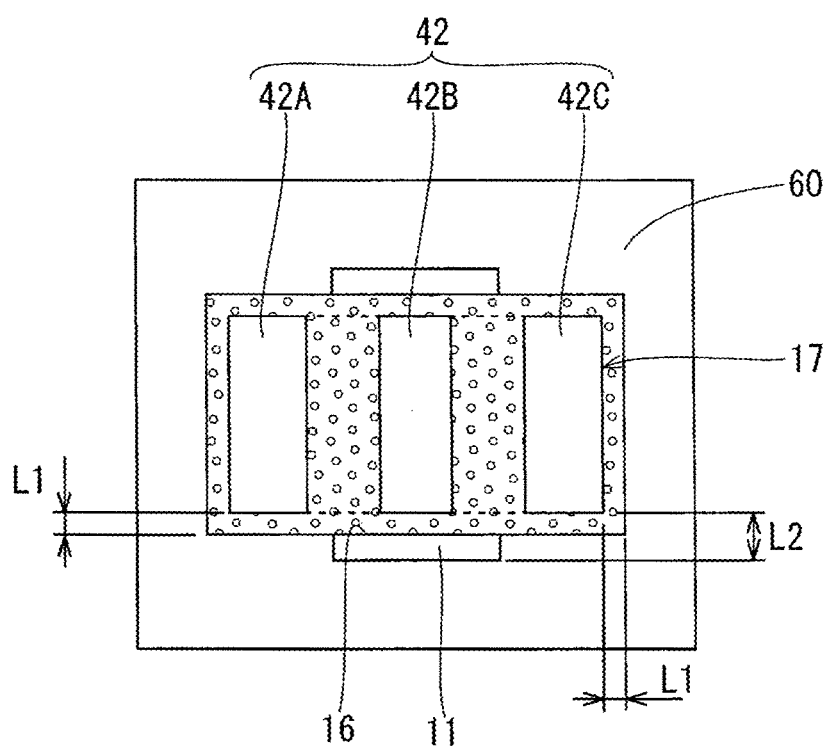
FIG. 15 is a plan cross-sectional view of a wiring board with a built-in electronic component.

FIGS. 14 and 15 illustrate a wiring board (10V) with a built-in electronic component according to a second embodiment. As illustrated in FIG. 14, in the wiring board (10V) with a built-in electronic component of the present embodiment, a frame-shaped pattern 60 is formed on each of the F surface (11F) and the S surface (11S) of the core substrate 11 so as to surround the cavity 16. Then, the via conductors (21D) that are connected to the negative terminal electrodes (42A, 42C) of the MLCC 17 and via conductors (21D) that are connected to the frame-shaped pattern 60 are connected by the first conductor layer 22, and the frame-shaped pattern 60 is used as the ground.

Further, on the F surface (11F) and the S surface (11S) of the core substrate 11, as illustrated in FIG. 15, a shortest distance (L2) between the positive terminal electrode (42B) and an inner edge part of the frame-shaped pattern 60 is larger than a shortest distance (L1) between the negative terminal electrodes (42A, 42C) and the inner edge part of the frame-shaped pattern 60. As a result, that the positive terminal electrode (42B) becomes electrically connected to the frame-shaped pattern 60 due to manufacturing variations can be prevented. Further, even when the negative terminal electrodes (42A, 42C) become electrically connected to the frame-shaped pattern 60 due to manufacturing variations, since the negative terminal electrodes (42A, 42C) are already connected to the frame-shaped pattern 60 via the first conductor layer 22 and the like and are at the same potential as the frame-shaped pattern 60, it does not cause any problem.

Other Embodiments

The present invention is not limited to the above-described embodiments. For example, embodiments described below are also included in the technical scope of the present invention. Further, in addition to the embodiments described below, the present invention can also be embodied in various modified forms within the scope without departing from the spirit of the present invention.

(1) In the wiring board 10 with a built-in electronic component of the first embodiment and the wiring board (10V) with a built-in electronic component of the second embodiment, the build-up layers (20, 20) are respectively laminated front and back sides of the core substrate 11. However, it is also possible to have a structure in which a build-up layer is laminated only on a surface on one of the front and back sides of the substrate.

(2) In the wiring board 10 with a built-in electronic component of the first embodiment and the wiring board (10V) with a built-in electronic component of the second embodiment, the number of the via conductors (21D) that are connected to each of the terminal electrodes 42 of the MLCC 17 is the same. However, the number of the via conductors (21D) that are connected to each of the terminal electrodes 42 may be different.

Figure 16A:
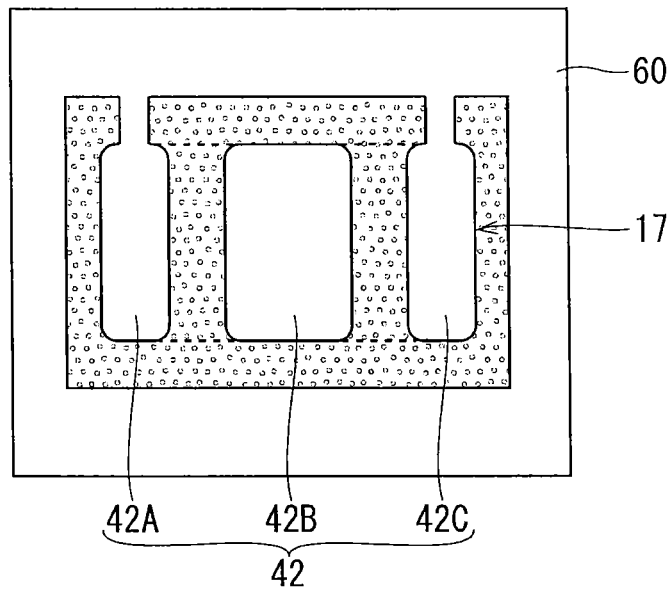
FIGS. 16A and 16B are plan cross-sectional view of a wiring board with a built-in electronic component according to a modified embodiment.
Figure 16B:
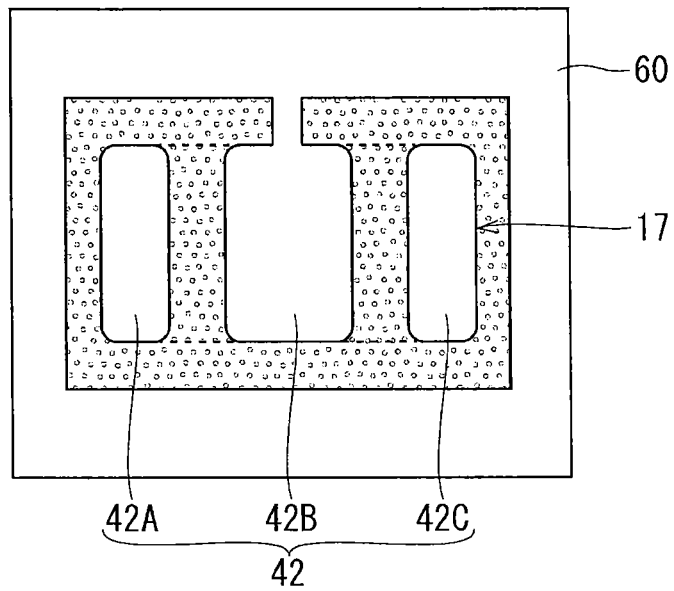

(3) In the wiring board (10V) with a built-in electronic component of the second embodiment, on the F surface (11F) and the S surface (11S) of the core substrate 11, the frame-shaped pattern 60 and the MLCC 17 are not connected to each other. However, as illustrated in FIGS. 16A and 16B, it is also possible to have a structure in which the terminal electrodes 42 on the two ends of the MLCC 17 are connected to the frame-shaped pattern 60, or a structure in which the terminal electrode 42 at the center of the MLCC 17 is connected to the frame-shaped pattern 60. Further, among the three electrodes, the terminal electrode at the center may be either a positive or a negative terminal electrode, and the terminal electrodes at the two ends may be either positive or negative terminal electrodes.

(4) Further, in the first embodiment, the terminal electrode 42 at the center of the MLCC 17 and the terminal electrodes (42, 42) at the two ends have the same width. However, as illustrated in FIGS. 16A and 16B, the terminal electrode 42 at the center of the MLCC 17 and the terminal electrodes 42 at the two ends may have different widths.

In a wiring board with a built-in electronic component, an electronic component such as a multilayer ceramic capacitor (MLCC) may be accommodated in a cavity.

In a wiring board with a built-in electronic component, power loss due to ESL (Equivalent Series Inductance), ESR (Equivalent Series Resistance) or the like of a circuit including the electronic component may occur.

A wiring board with a built-in electronic component according to an embodiment of the present invention is capable of suppressing power loss, and another embodiment of the present invention provides a method for manufacturing such a wiring board.

A wiring board with a built-in electronic component according to an embodiment of the present invention includes: a substrate that has a cavity; an electronic component that is formed in a shape of a rectangular cuboid and has three metal film-like terminal electrodes on its outer surface, and is accommodated in the cavity; a conductor layer that is laminated via an interlayer insulating layer on the substrate and on the electronic component; and via conductors that connect between the conductor layer and the three terminal electrodes of the electronic component. The three terminal electrodes are arrayed in parallel on an outer surface of the electronic component where the interlayer insulating layer is laminated and are arrayed such that polarities of terminal electrodes that are adjacent to each other are opposite to each other.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board with a built-in electronic component, comprising:
   a substrate having a cavity;
   an interlayer insulating layer formed on the substrate such that the interlayer insulating layer is covering the cavity of the substrate;
   a conductor layer formed on the interlayer insulating layer;
   an electronic component accommodated in the cavity of the substrate and comprising a rectangular cuboid body and a tripolar structure consisting of three terminal electrodes such that each of the three terminal electrodes has a metal firm form formed on an outer surface of the rectangular cuboid body; and
   a plurality of via conductors formed in the interlayer insulating layer such that the plurality of via conductors is connecting the conductor layer and the three terminal electrodes of the electronic component,
   wherein the three terminal electrodes are arrayed in parallel on the outer surface of the rectangular cuboid body such that adjacent terminal electrodes have opposite polarities, and the three terminal electrodes comprise two terminal electrodes positioned on end portions of the rectangular cuboid body respectively and one terminal electrode positioned between the two terminal electrodes such that one of the two terminal electrodes is extending to cover one side surface of the rectangular cuboid body and that the other one of the two terminal electrodes is extending to cover an opposite side surface of the rectangular cuboid body.

2. A wiring board with a built-in electronic component according to claim 1, further comprising:
   a second interlayer insulating layer formed on the substrate such that the second interlayer insulating layer is covering the cavity of the substrate on an opposite side of the substrate with respect to the interlayer insulating layer;
   a second conductor layer formed on the second interlayer insulating layer; and
   a plurality of second via conductors formed in the second interlayer insulating layer,
   wherein the substrate has the cavity penetrating through the substrate, the electronic component comprises three second terminal electrodes such that each of the three second terminal electrodes has a metal film form formed on a second outer surface of the rectangular cuboid body on an opposite side with respect to the outer surface, the plurality of second via conductors is connecting the second conductor layer and the three second terminal electrodes of the electronic component, and the three second terminal electrodes are arrayed in parallel on the second outer surface of the rectangular cuboid body such that adjacent second terminal electrodes have opposite polarities.

3. A wiring board with a built-in electronic component according to claim 1, wherein the plurality of via conductors is formed such that each of the three terminal electrodes is connected to a plurality of the via conductors in a same number.

4. A wiring board with a built-in electronic component according to claim 1, further comprising:
   a frame-shaped conductor pattern formed on a surface of the substrate such that a shortest distance between two of the three terminal electrodes in one polarity and an inner edge of the frame-shaped conductor pattern is formed greater than a shortest distance between one of the three terminal electrodes in an opposite polarity and the inner edge of the frame-shaped conductor pattern.

5. A wiring board with a built-in electronic component according to claim 1, further comprising:
   a frame-shaped conductor pattern formed on a surface of the substrate such that a shortest distance between one of the three terminal electrodes in one polarity and an inner edge of the frame-shaped conductor pattern is formed greater than a shortest distance between two of the three terminal electrodes in an opposite polarity and the inner edge of the frame-shaped conductor pattern.

6. A wiring board with a built-in electronic component according to claim 1, wherein the electronic component is a multilayer ceramic capacitor.

7. A wiring board with a built-in electronic component according to claim 1, wherein the three terminal electrodes comprise the two terminal electrodes positioned on the end portions of the rectangular cuboid body respectively such that the two terminal electrodes are connected to ground.

8. A wiring board with a built-in electronic component according to claim 1, wherein the three terminal electrodes comprise a positive terminal electrode positioned in a center of the three terminal electrodes and two negative terminal electrodes positioned on end portions of the rectangular cuboid body respectively adjacent to the positive terminal electrode.

9. A wiring board with a built-in electronic component according to claim 1, wherein the three terminal electrodes comprise the two terminal electrodes positioned on the end portions of the rectangular cuboid body respectively such that the one terminal electrode is connected to ground.

10. A wiring board with a built-in electronic component according to claim 1, wherein the plurality of via conductors is connected to the three terminal electrodes such that a number of the via conductors connected to negative polarity is greater than a number of the via conductors connected to positive polarity.

11. A wiring board with a built-in electronic component according to claim 3, further comprising:
    a frame-shaped conductor pattern formed on a surface of the substrate such that a shortest distance between two of the three terminal electrodes in one polarity and an inner edge of the frame-shaped conductor pattern is formed greater than a shortest distance between one of the three terminal electrodes in an opposite polarity and the inner edge of the frame-shaped conductor pattern.

12. A wiring board with a built-in electronic component according to claim 3, further comprising:
    a frame-shaped conductor pattern formed on a surface of the substrate such that a shortest distance between one of the three terminal electrodes in one polarity and an inner edge of the frame-shaped conductor pattern is formed greater than a shortest distance between two of the three terminal electrodes in an opposite polarity and the inner edge of the frame-shaped conductor pattern.

13. A wiring board with a built-in electronic component according to claim 3, wherein the electronic component is a multilayer ceramic capacitor.

14. A wiring board with a built-in electronic component according to claim 3, wherein the three terminal electrodes comprise the two terminal electrodes positioned on the end portions of the rectangular cuboid body respectively such that the two terminal electrodes are connected to ground.

15. A wiring board with a built-in electronic component according to claim 3, wherein the three terminal electrodes comprise a positive terminal electrode positioned in a center of the three terminal electrodes and two negative terminal electrodes positioned adjacent to the positive terminal electrode.

16. A method for manufacturing a wiring board with a built-in electronic component, comprising:
    forming a cavity in a substrate;
    positioning in the cavity of the substrate an electronic component comprising a rectangular cuboid body and a tripolar structure consisting of three terminal electrodes such that each of the three terminal electrodes has a metal film form formed on an outer surface of the rectangular cuboid body;
    forming an interlayer insulating layer on the substrate such that the interlayer insulating layer covers the cavity of the substrate;
    forming a conductor layer on the interlayer insulating layer; and
    forming a plurality of via conductors in the interlayer insulating layer such that the plurality of via conductors connects the conductor layer and the three terminal electrodes of the electronic component,
    wherein the three terminal electrodes are arrayed in parallel on the outer surface of the rectangular cuboid body such that adjacent terminal electrodes have opposite polarities, and the three terminal electrodes comprise two terminal electrodes positioned on end portions of the rectangular cuboid body respectively and one terminal electrode positioned between the two terminal electrodes such that one of the two terminal electrodes is extending to cover one side surface of the rectangular cuboid body and that the other one of the two terminal electrodes is extending to cover an opposite side surface of the rectangular cuboid body.

17. A method for manufacturing a wiring board with a built-in electronic component according to claim 16, further comprising:
    forming a second interlayer insulating layer on the substrate such that the second interlayer insulating layer covers the cavity of the substrate on an opposite side of the substrate with respect to the interlayer insulating layer;
    forming a second conductor layer on the second interlayer insulating layer; and
    forming a plurality of second via conductors in the second interlayer insulating layer,
    wherein the forming of the cavity comprises forming the cavity penetrating through the substrate, the electronic component comprises three second terminal electrodes such that each of the three second terminal electrodes has a metal film form formed on a second outer surface of the rectangular cuboid body on an opposite side with respect to the outer surface, the plurality of second via conductors is connecting the second conductor layer and the three second terminal electrodes of the electronic component, and the three second terminal electrodes are arrayed in parallel on the second outer surface of the rectangular cuboid body such that adjacent second terminal electrodes have opposite polarities.

18. A method for manufacturing a wiring board with a built-in electronic component according to claim 16, wherein the forming of the via conductors comprises forming the plurality of via conductors such that each of the three terminal electrodes is connected to a plurality of the via conductors in a same number.

19. A method for manufacturing a wiring board with a built-in electronic component according to claim 16, further comprising:
    forming a frame-shaped conductor pattern on a surface of the substrate such that a shortest distance between two of the three terminal electrodes in one polarity and an inner edge of the frame-shaped conductor pattern is formed greater than a shortest distance between one of the three terminal electrodes in an opposite polarity and the inner edge of the frame-shaped conductor pattern.

20. A method for manufacturing a wiring board with a built-in electronic component according to claim 1, wherein the electronic component is a multilayer ceramic capacitor.

* * * * *